United States Patent
Ding et al.

(10) Patent No.: US 7,463,459 B2
(45) Date of Patent: Dec. 9, 2008

(54) SELF-PINNED READ SENSOR DESIGN WITH ENHANCED LEAD STABILIZING MECHANISM

(75) Inventors: Meng Ding, Mountain View, CA (US); Robert E. Fontana, Jr., San Jose, CA (US); Kuok San Ho, Santa Clara, CA (US); Neil Leslie Robertson, Palo Alto, CA (US); Ching Hwa Tsang, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 476 days.

(21) Appl. No.: 10/781,548

(22) Filed: Feb. 18, 2004

(65) Prior Publication Data

US 2005/0180061 A1 Aug. 18, 2005

(51) Int. Cl.
G11B 5/39 (2006.01)
(52) U.S. Cl. .................... 360/324.12; 360/319
(58) Field of Classification Search .......... 360/319, 360/324.11, 324.12, 324.1, 324.2
See application file for complete search history.

(56) References Cited

U.S. PATENT DOCUMENTS

| | | | |
|---|---|---|---|
| 5,583,725 A | 12/1996 | Coffey et al. | 360/113 |
| 5,898,547 A | 4/1999 | Fontana, Jr. et al. | 360/113 |
| 5,901,018 A | 5/1999 | Fontana, Jr. et al. | 360/104 |
| 6,127,053 A * | 10/2000 | Lin et al. | 428/811.2 |
| 6,134,091 A | 10/2000 | Toki et al. | 360/324.11 |
| 6,191,926 B1 | 2/2001 | Everitt et al. | 360/324.11 |
| 6,219,207 B1 * | 4/2001 | Pinarbasi | 360/322 |
| 6,295,187 B1 * | 9/2001 | Pinarbasi | 360/324.11 |
| 6,632,474 B1 * | 10/2003 | Horng et al. | 427/131 |
| 6,867,953 B2 * | 3/2005 | Gill | 360/324.12 |
| 2001/0030887 A1 | 10/2001 | Ishikawa et al. | 365/158 |
| 2002/0024780 A1 | 2/2002 | Mao et al. | 360/324.11 |
| 2002/0181163 A1 * | 12/2002 | Werner | 360/319 |
| 2003/0021072 A1 | 1/2003 | Hayakawa | 360/324.2 |
| 2003/0197985 A1 | 10/2003 | Gill | 360/324.11 |
| 2003/0206379 A1 | 11/2003 | Lin et al. | 360/319 |
| 2004/0196597 A1 * | 10/2004 | Marinero | 360/324.12 |
| 2005/0002129 A1 * | 1/2005 | Gill | 360/324.11 |
| 2005/0017314 A1 * | 1/2005 | Gill | 257/421 |
| 2005/0018365 A1 * | 1/2005 | Gill | 360/324.11 |
| 2006/0087771 A1 * | 4/2006 | Gill | 360/324.11 |

FOREIGN PATENT DOCUMENTS

| EP | 573149 A2 * | 12/1993 |
|---|---|---|
| JP | 10302227 A * | 11/1998 |
| JP | 2002304711 A * | 10/2002 |

* cited by examiner

Primary Examiner—William J Klimowicz
(74) Attorney, Agent, or Firm—Zilka-Kotab, PC

(57) ABSTRACT

A self pinned magnetoresistive sensor that has a relatively thick compressive material at either side to assist with self pinning. A shield having recessed portions at either side of the sensor area allows room for a thicker compressive layer than would otherwise be possible.

15 Claims, 3 Drawing Sheets

SELF-PINNED READ SENSOR DESIGN WITH ENHANCED LEAD STABILIZING MECHANISM

FIELD OF THE INVENTION

The present invention relates to magnetoresistive sensors, and more particularly to magnetic stabilization of a pinned layer in a self pinned magnetoresistive sensor.

BACKGROUND OF THE INVENTION

The heart of a computer is a magnetic disk drive that includes a magnetic disk, a slider where a magnetic head assembly including write and read heads is mounted, a suspension arm, and an actuator arm. The slider is biased by the suspension arm toward the surface of the magnetic disk. When the magnetic disk rotates, the rotating magnetic disk moves air adjacent an air bearing surface (ABS) of the slider, causing the slider to fly on the air bearing. When the slider flies on the air bearing, the actuator arm swings the suspension arm to place the magnetic head assembly over selected circular tracks on the rotating magnetic disk, where signal fields are written and read by the write and read heads, respectively. The write and read heads are connected to processing circuitry that operates according to a computer program to implement write and read functions.

An exemplary high performance read head employs a magnetoresistive read element for sensing the signal fields from the rotating magnetic disk. A magnetoresistive sensor detects magnetic field signals through the resistance changes of a read element as a function of the strength and direction of magnetic flux being sensed by the read element. In the last decade, such read elements have been predominantly in the form of giant magnetoresistive sensors (GMR). More recently, Tunnel Junction sensors have been investigated for use as magnetic read elements.

A GMR element also referred to in the art as a spin valve magnetoresistive element includes a pair of ferromagnetic layers separated by a non-magnetic electrically conductive spacer layer. The magnetization of one of the layers is fixed or "pinned" while the other is biased but free to rotate in response to a magnetic field. Due to the spin dependent scattering of electrons through the spacer layer, current flow through the spacer layer depends upon the relative orientation of the magnetization of the free and pinned magnetic layers. Current flow is at a maximum when the free and pinned layers are magnetized parallel to one another, whereas current flow is at a minimum when the magnetizations are anti-parallel. The free and pinned layers are generally set at 90 degrees to one another in the absence of a magnetic field in order to generate the most linear resistance change in response to a magnetic field signal. Most GMR sensors in use incorporate a current in plane design (CIP) in which current flows from one side of the sensor to the other in the plane of the layers described above. Another type of GMR sensor termed a current perpendicular to plane (CPP) sensor has a design in which current flows through the sensor in a direction perpendicular to the plane of the sensors.

A Magnetic Tunnel Junction sensor (MTJ) is comprised of two ferromagnetic layers separated by a thin insulating tunnel barrier layer and is based on the phenomenon of spin-polarized electron tunneling. The insulating tunnel barrier layer is thin enough that quantum mechanical tunneling occurs between the ferromagnetic layers. The tunneling phenomenon is electron-spin dependent, making the magnetic response of the MTJ a function of the relative orientations and spin polarizations of the two ferromagnetic layers.

Both GMR sensors and TMR sensors require a mechanism for maintaining the pinned layer in its pinned state. Traditionally, this has been achieved by depositing the pinned layer such that it is exchange coupled with an antiferromagnetic material such as for example PtMn. Although an antiferromagnetic material in and of itself is not magnetic, when exchange coupled with a magnetic material it very strongly fixes the magnetization of the magnetic layer, In order to effectively fix the magnetization of the pinned layer, the antiferromagnetic layer must be very thick as compared with the other layers of the sensor. Ever increasing recording density requirements require ever smaller gap height and therefore thinner sensors. The thick AFM layer is a significant cost to the thickness budget. Also, antiferromagnetic materials lose there antiferromagnetic properties at a given temperature called the blocking temperature. Therefore, certain events such as an electrostatic discharge or a slider contacting the disk can elevate the temperature of the AFM sufficiently to lose the pinning of the pinned layer. Such an event renders the head useless.

In order to further improve pinning of the pinned layer, heads have recently been constructed with anti-parallel coupled pinned layers (AP coupled pinned layers). In such a sensor the pinned layer consists of a pair of ferromagnetic layers separated by a non-magnetic coupling layer such as Ru. The ferromagnetic layers are usually constructed to have magnetic thicknesses that are close to each other but not exactly the same. The antiparallel magnetostatic coupling of the two ferromagnetic layers greatly increases the pinning, and the slight difference in magnetic thicknesses creates a net magnetism that allows magnetic orientation of the AP coupled pinned layer to be set in a magnetic field. In such an AP coupled pinned layer, the ferromagnetic layer furthest from the sensor's spacer layer is exchange coupled with an AFM as discussed in the preceding paragraph.

Even more recently, in order to minimize sensor height and thereby increase data density, attempts have been made to construct sensors in which the pinned layer does not require exchange coupling to an AFM. Although some such sensors have used a thin seed layer of PtMn to initiate the desired crystallographic structure in the pinned layer, the thickness of the PtMn in such self pinned sensors is much too thin to exchange couple and pin the pinned layer. Such self pinned sensors achieve pinning through a combination of intrinsic anisotropy of the pinned layer, magnetostatic coupling, and magnetostriction. The two antiparallel coupled ferromagnetic layers are constructed to have as close as possible a magnetic thickness. The closer the magnetic thickness, the stronger the magnetostatic coupling between the layers. The antiparallel coupled layers are also constructed of a material having a strong positive magnetostriction. Magnetostriction is the property of a material that it is magnetized in a particular direction when placed under a compressive stress. The construction of the head generates a certain amount of compressive stress on the sensor which, when combined with the magnetostriction of the pinned layers, assists pinning. Such self pinned sensors have shown promise in greatly decreasing the thickness of the sensor, however they suffer from instability. The pinned layers of such sensor have been prone to flip direction, a catastrophic event which renders the head useless. Therefore, there remains a need for a mechanism for decreasing the thickness budget by using a self pinned layer while providing improved stability to the pinned layer to avoid amplitude flipping.

SUMMARY OF THE INVENTION

The present invention provides a magnetoresistive structure for improved pinning of a self-pinned layer in a magnetoresistive sensor. The invention includes a sensor built upon a shield having a raised portion and laterally opposed recessed portions extending laterally there from. The invention also includes a magnetoresistive element formed above the raised portion of the shield. The magnetoresistive element can be for example a GMR sensor (CIP or CPP), or a TMR. First and second compressive layers are formed above the recessed portions of the shield. First and second hard magnetic layers are formed over the compressive layers.

The recessed portions of the shield advantageously allow the compressive layers to be deposited thicker than would otherwise be possible and without creating topography problems for later photolithography processes. Compressive materials such as for example Cu are materials that when formed with a discontinuity tend to expand into the discontinuity rather retract from it as some other materials might do. The inventors have found that such compressive materials, when combined with the magnetostatic properties of a pinned layer, greatly enhance pinning. The inventors have also discovered that the thicker the compressive layer is the greater the assistance to pinning will be. Therefore, the thicker compressive layer allowed by the recessed areas of the shield provide greater pinning assistance than would otherwise be possible.

The sensor of the present invention can be a GMR sensor (CIP OR CPP) or could be a Tunnel valve (TMR). If a CPP GMR or a TMR is used, then the shield will be in electrical communication with the sensor. Essentially the shield becomes a lead, although further conductive layers may or may not be included between the shield and the sensor. If the sensor is a CIP GMR, then the shield will be electrically insulated from the sensor by an insulating gap layer. In such case leads may be provided to conduct current to opposite lateral sides of the sensor to provide a sense current to the sensor.

The In the case of a CIP sensor, there will be an insulating layer between the shield and the sensor, and in the case of a CPP or MTJ sensor there will be a conductive layer or no layer at all between the shield and the sensor. Constructing a self pinned sensor having a relatively thick compressive layer at each side of the sensor would cause severe topography above the compressive layer, since the structure would have to flare upwards severely from each edge of the sensor to accommodate the thicker compressive layer. This will create problems for later lithography processes used to construct the upper shield and the write head, which is generally constructed after the read element. Therefore, constructing the sensor on a shield having a raised portion on which the sensor is constructed and recessed side portions to accommodate the thicker compressive material greatly improves the topography at the top of the structure greatly facilitating later processing steps.

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out this invention. This description is made for the purpose of illustrating the general principles of this invention and is not meant to limit the inventive concepts claimed herein.

Figure 1:
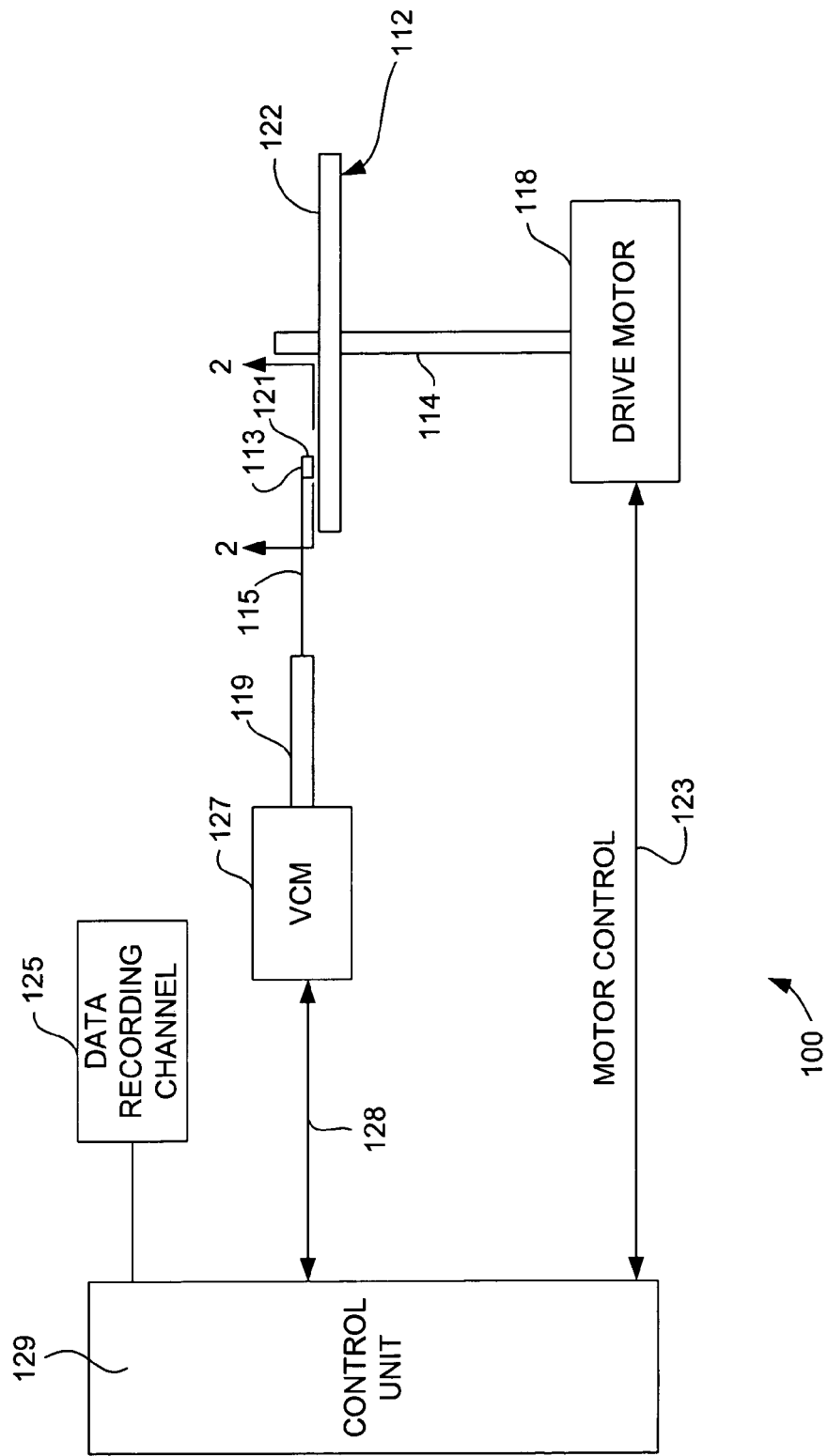
FIG. 1 is a simplified, partial schematic view of a magnetic storage system in which the present invention may be embodied.

Referring now to FIG. 1, there is shown a disk drive 100 embodying this invention. As shown in FIG.1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 is moved radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

The above description of a typical magnetic disk storage system, and the accompanying illustration of FIG. 1 are for representation purposes only. It should be apparent that disk storage systems may contain a large number of disks and actuators, and each actuator may support a number of sliders.

Figure 2:
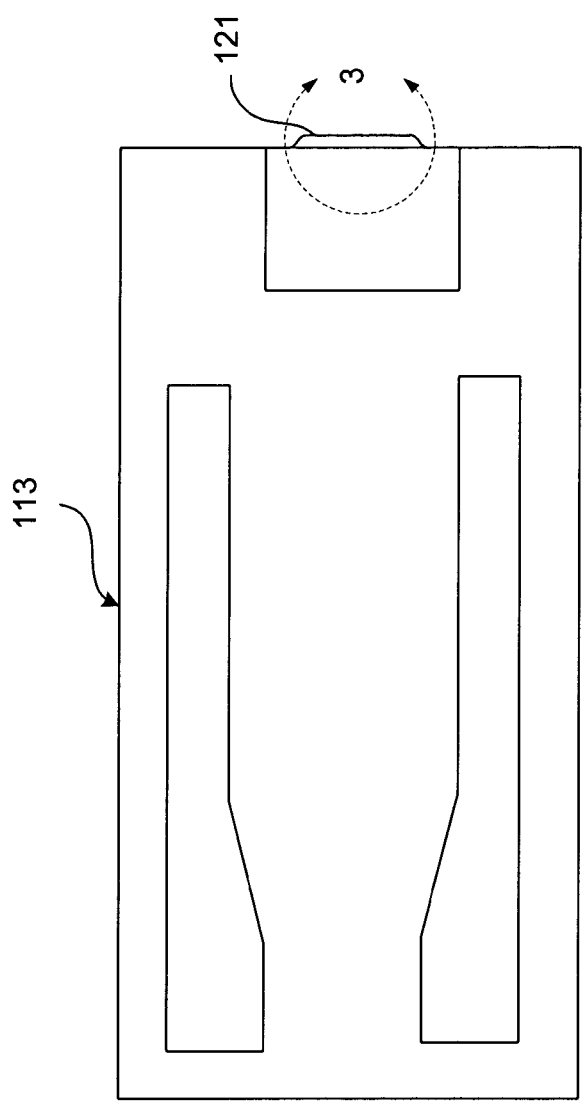
FIG. 2 is an ABS view, taken from line 2-2 and enlarged, of a slider.

With reference to FIG. 2, an ABS view of the slider 113, taken from line 2-2 of FIG. 1, indicates the arrangement of the magnetic head 121 on the slider. The magnetic head 121 typically is located on the trailing edge of the slider, because this is the location of the slider 121 which flies closest to the magnetic disk.

Figure 3:
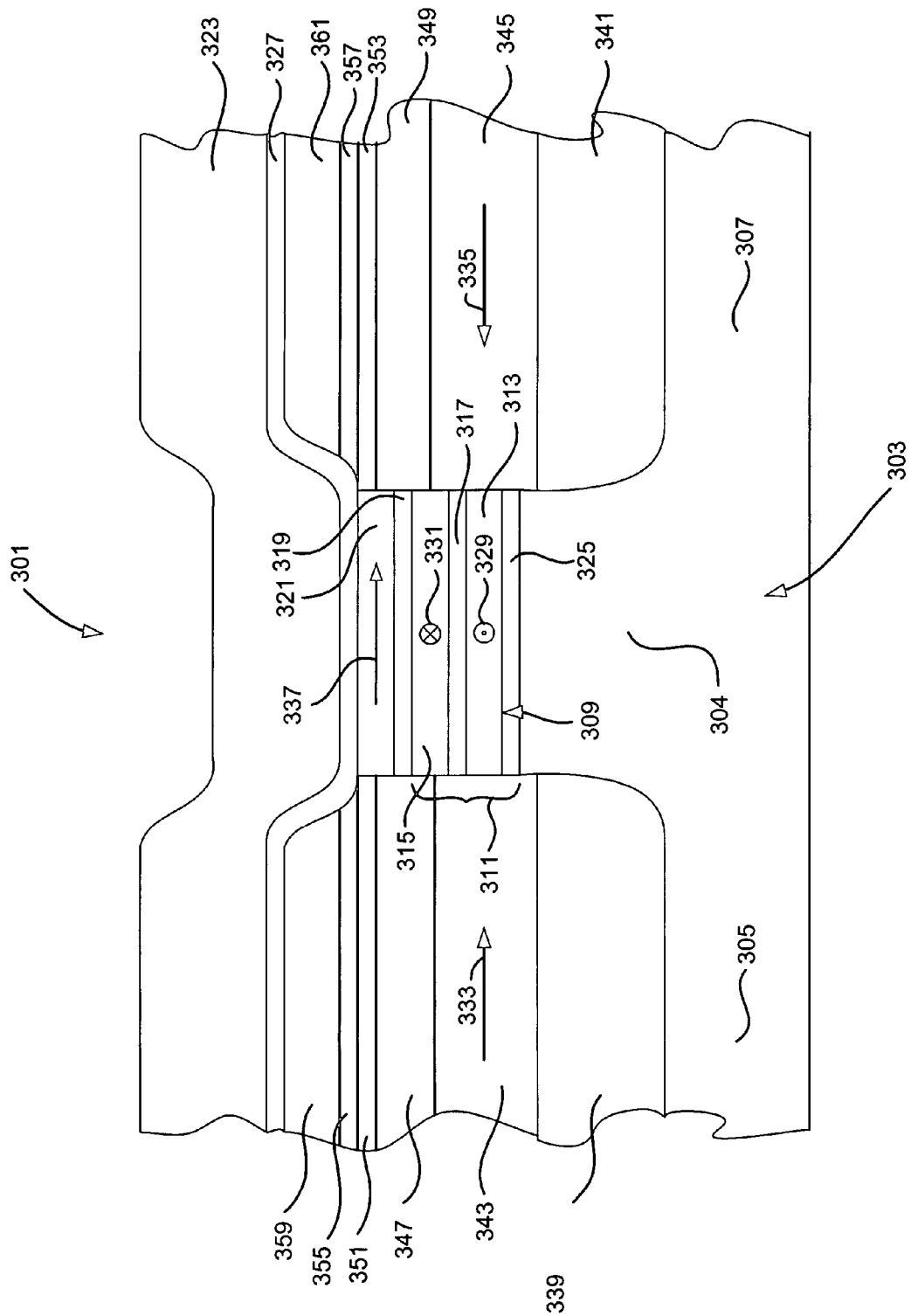
FIG. 3 is a view, taken from circle 3 of FIG. 2 and enlarged, of a read sensor according to an embodiment of the present invention.

FIG. 3 shows a greatly enlarged view taken from circle 3-3 illustrating a magnetic sensor generally referred to as 301 according to an embodiment of the present invention. While the particular embodiment illustrated with reference to FIG. 3 is a Tunnel Junction Magnetoresistive sensor (TMR), the invention sensor could also be embodied in a head using a CPP or CIP GMR sensor. The head 301 includes a first shield or lower shield 303, which has a raised center portion 304 and laterally extending first and second side portions 305, 307 that are recessed from the raised portion 304.

A magnetoresistive element generally depicted as 309 in FIG. 3 includes an anti-parallel coupled pinned layer 311, which includes first and second ferromagnetic layers 313, 315 separated by a anti-parallel coupling layer 317. The ferromagnetic layers 313, 315 could be formed of many ferromagnetic materials and are preferably formed of CoFe and have magnetic thicknesses that are as close as possible to one another. The anti-parallel coupling layer, 317 can be formed of several non-magnetic materials and is preferably constructed of Ru having a thickness of around 8 angstroms. A non-magnetic electrically insulating barrier layer 319 is formed over the AP pinned layer 311, and is preferably formed of $Al_2O_3$, although many other electrically insulating materials could be suitable as well. A magnetically free layer 321 is formed over the barrier layer 319 and is preferably constructed of CoFe/NiFe, although other materials would be suitable as well. A second shield, or upper shield 323 is formed over the free layer 321 and extends laterally outward as indicated in FIG. 3. The second shield is preferably formed of the same material as the first shield, but could be formed of some other magnetic material as well. Although not required, if the first and second shields 303, 323 are constructed of an electrically conductive material, improved conductivity can be achieved by providing electrically conductive leads 325, 327, disposed between the read element 309 and first and second shields 303, 323. The leads 325, 327 can be constructed of many electrically conductive materials, but are preferably constructed of Cu or Au.

With continued reference to FIG. 3, the ferromagnetic layers 313, 315 of the pinned layer 311, have magnetizations that are pinned into and out of the plane of the page as indicated by symbols 329, 331. Although shown with the magnetization of the bottom 313 being into the page and the top 315 being out of the page, the orientations could be reversed. The positive magnetostriction of the material assists pinning of the layers 313, 315 when the layers are placed under a compressive stress as indicated by arrows 333, 335. Further pinning assistance is provided by annealing the pinned layers in the presence of a magnetic field in order to set the magnetic anisotropy of the layer 313, 315 perpendicular to the plane of the page.

The free layer 321 has a magnetization that is biased perpendicular to that of the pinned layer 311 as indicated by arrow 337. While the arrow is shown as being oriented toward the right, it could also be pointed toward the left. While the magnetization of the free layer is biased as shown 337 it is free to rotate in the presence of a magnetic field. The mechanism for biasing the free layer will be discussed in greater detail below.

With further reference to FIG. 3, first and second insulating layers 339 and 341 are formed on top of the recessed side portions 305, 307. While the view depicted in FIG. 3 indicates the insulation layers as being two distinct layers, those skilled in the art will appreciate that the layers could be connected at a point which would be into the plane of the page.

First and second layers of compressive material 343, 345 formed above the insulating layers provide compressive stresses 333, 335 to assist pinning of the pinned layer 311. A compressive material is a material which when formed with a discontinuity, such as that provided by magnetoresistive element 309, tends to want to expand into the discontinuity rather than retract from it as some other materials would do. Rh, for example, exhibits such a compressive behavior, although other materials could be used as well. The compressive force 333, 335 provided by the compressive material 343, 345 greatly enhances the self pinning of the pinned layer 311, and advantageously prevents amplitude flipping.

First and second hard bias layers (HB) 347, 349 formed above the compressive material layer provide biasing to maintain the free magnetic orientation 337 of the free layer 321 oriented as desired. As will be appreciated by those skilled in the art, the HB layers 347, 349 should be disposed substantially adjacent the free layer 321 to achieve effective biasing of the free layer 321 The HB layers 347, 349 can be for example CoPt, and could include a CrMo seed layer. The HB layers 347, 349 could also be CoPtCr, and could include a Cr seed layer. Further the invention contemplates constructing the HB layers of still other hard magnetic materials.

Third and fourth compressive layers 351, 353, which could be for example Rh, can be provided over the HB layers 347, 349, followed by Ta capping layers 355, 357. In addition a thin (approximately 20 angstrom) Ta seed layer may be provided under the third and fourth compressive layers 351, 353. These additional compressive layers 351, 353 can provide further pinning assistance for avoiding amplitude flipping. Insulation layer 359, 361 are provided over the Ta capping layer to ensure that sense current flows only through the MR element 309 as desired.

The inventors have found that providing a compressive material 343, 345 at the sides of the self pinned MR element 309, greatly increases the switching field that would be required to cause undesirable amplitude flipping. Furthermore, the inventors have found that the greater the thickness of the compressive layers 343, 345, the greater this switching field becomes. Whereas magnetic heads are generally constructed with relatively flat bottom leads, such a construction would not allow for thicker compressive layers. In such a case, providing thick compressive layers 343, 345, 351, 353, would cause the upper shield 323 to flair wildly up at the sides, leading to unacceptable topography for subsequent manufacturing processes. The inventors have included the innovative recesses portions 305, 307 in order to provide room for the compressive layers 343, 345, 351, 353 without sacrificing topography. By building the insulation layers 339, 341 into the recessed portions 305, 307 of the shield 303 the stabilization structure formed thereon, can be manufactured with increased thickness and in a controllable fashion to the extent that the self-pinning layer can be adequately pinned by the added stress provided.

The magnetic sensor 301 can be formed by first depositing a magnetic layer, such as NiFe onto a substrate (not shown). The NiFe can be deposited by a variety of methods including electroplating. The layers of the MR element 309 can then be deposited as full film layers and then patterned with a photoresist mask over the area that is to become the MR element 309. An ion milling process can be used to remove MR and shield material in a controllable manner creating the MR element 309 and recessed portions 305, 307. Following up with a high angle ion milling step may be desirable to remove redeposited material from the sides of the sensor 309 and raised portion 304 of the shield 303. Thereafter, the insulation layers 339, 341, first and second compressive layers 343, 345, hard bias layers 347, 349, third and fourth compressive layers 351, 353, cap layers 355, 357, and insulation layers 359, 361 can be deposited.

An alternate process for constructing the magnetic head 301 includes depositing the shield 303, then depositing a masking layer (such as photoresist) over the area that is to become the raised portion 304. An ion milling process can then be performed to remove material to form the raised portion 304 of the shield 303. Insulation material can then be deposited full film, and the photoresist can be lifted off leaving insulation layers 339, 341. Following up with a planarizing step such as chemical mechanical polishing can provide an advantageous planar surface on which to form the subsequent layers. Alternatively, the photoresist layer could be removed before deposition of the full film insulation layer and a CMP process could be used to both planarize the structure and remove insulation from the raised portion 304 on which the MR element 303 will be built.

It will be appreciated by those skilled in the art that the present invention can be utilized with a GMR sensor as well as a TMR. If a GMR sensor were used as the MR element, insulating layers, termed first and second gap layer, would be provided between the MR element 309 and the first and second shields 303, 323. Leads would then be formed to provide sense current to each lateral side of the MR element 309. In that case both the upper compressive layer 351, 353 and the lower compressive layers 343, 345 could double as a lead for providing sense current.

It can be seen that the present invention overcomes many of the difficulties of the prior art, by providing a pinning scheme for improving resistance to amplitude flipping in a self pinned MR sensor. While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A magnetic sensor, comprising
   a first magnetic shield layer, having a raised portion and first and second laterally opposed recessed portions extending laterally there from;
   a magnetoresistive sensor formed above said raised portion of said first magnetic shield layer, said magnetoresistive sensor having an anti-parallel coupled self pinned layer, and having a free magnetic layer;
   first and second compressive layers formed above said first and second recessed portions of said shield layer; and
   first and second hard magnetic bias layers formed above said first and second compressive layers; and
   third and fourth compressive layers comprising Rh formed above said first and second hard bias layers.

2. A magnetic sensor as in claim 1, wherein said anti-parallel pinned layer includes first and second ferromagnetic layers having a positive magnetostriction separated by an anti-parallel coupling layer, and wherein pinning of said self pinned layer is assisted by a combination of magnetostriction and magnetostatic coupling between said first and second ferromagnetic layers.

3. A magnetic sensor as in claim 2 wherein said first and second ferromagnetic layers comprise a material having a positive magnetostriction.

4. A magnetic sensor as in claim 2 wherein at least one of said ferromagnetic layers of said pinned layer comprises CoFe.

5. A magnetic sensor as in claim 1, wherein said self pinned layer is pinned without the assistance of exchange coupling to an antiferromagnetic material.

6. A magnetic sensor as in claim 1 further comprising first and second layers of hard magnetic material formed over said first and second compressive layers, and first and second metallic layers formed over said first and second layers of hard magnetic material.

7. A magnetic sensor as in claim 1 further comprising first and second hard magnetic layers formed above said recessed portions of said shield layer, said first and second hard magnetic layers comprising CoPt, and further comprising first and second CrMo seed layers.

8. A magnetic sensor as in claim 1 further comprising first and second hard magnetic layers formed above said recessed portions of said shield layer, said first and second hard magnetic layers comprising CoPtCr and further comprising first and second Cr seed layers.

9. A magnetic sensor as in claim 1 wherein said first and second compressive layers each have a thickness of at least 200 angstroms.

10. A magnetic sensor as in claim 1 wherein said first and second compressive layers each have a thickness of at least 750 angstroms.

11. A magnetic sensor as in claim 1 further comprising an insulating layer disposed between said anti-parallel pinned layer and said free magnetic layer.

12. A magnetic sensor as in claim 1 further comprising an electrically conductive layer disposed between said anti-parallel pinned layer and said free magnetic layer.

13. A magnetic sensor as in claim 1 wherein said shield layer is in electrical communication with said anti-parallel pinned layer.

14. A magnetic sensor as in claim 1 further comprising an electrically insulating layer disposed between said shield layer and said anti-parallel pinned layer.

15. A magnetic sensor as in claim 1 wherein said first and second compressive layers have a thickness of at least 17 angstroms.

* * * * *